US007263764B2

(12) United States Patent
Heistand, II et al.

(10) Patent No.: US 7,263,764 B2
(45) Date of Patent: Sep. 4, 2007

(54) METHOD FOR ADJUSTING PERFORMANCE CHARACTERISTICS OF A MULTILAYER COMPONENT

(75) Inventors: Robert Heistand, II, Myrtle Beach, SC (US); John L. Galvagni, Surfside Beach, SC (US); Georghe Korony, Myrtle Beach, SC (US)

(73) Assignee: AVX Corporation, Myrtle Beach, SC (US)

( * ) Notice: Subject to any disclaimer, the term of this patent is extended or adjusted under 35 U.S.C. 154(b) by 129 days.

(21) Appl. No.: 10/647,939

(22) Filed: Aug. 26, 2003

(65) Prior Publication Data

US 2004/0057192 A1 Mar. 25, 2004

Related U.S. Application Data

(62) Division of application No. 10/234,972, filed on Sep. 4, 2002, now Pat. No. 6,757,152.

(60) Provisional application No. 60/317,356, filed on Sep. 5, 2001.

(51) Int. Cl.
*H01C 17/00* (2006.01)

(52) U.S. Cl. .................. 29/610.1; 29/25.41; 29/25.42; 29/829; 29/831; 29/832; 174/255; 174/258; 333/12; 361/306.3; 361/763; 361/794

(58) Field of Classification Search ............... 29/610.1, 29/25.41, 25.42, 829, 831, 832; 174/255, 174/258; 333/12; 361/306.3, 763, 794
See application file for complete search history.

(56) References Cited

U.S. PATENT DOCUMENTS 4,439,813 A   3/1984   Dougherty et al.

(Continued)

FOREIGN PATENT DOCUMENTS

EP   1115129 A2   7/2001

(Continued)

OTHER PUBLICATIONS

PCT International Search Report, International Application No. PCT/US02/28100, International Filing Date: Sep. 5, 2002, Date of completion of International Search: Oct. 9, 2003, Date of mailing of International Search Report: Jan. 2, 2003.

*Primary Examiner*—A. Dexter Tugbang
*Assistant Examiner*—Tim Phan
(74) *Attorney, Agent, or Firm*—Dority & Manning, P.A.

(57) ABSTRACT

A method for adjusting the equivalent series resistance (ESR) of a multi-layer component includes providing at least first and second layers separated by an insulating layer, providing a resistive layer between the insulating layer and one of the first or second electrode layers, and adjusting the ESR of the component by varying the effective resistance of the resistive layer. The effective resistance may be varied by adjusting the composition or thickness of the resistive layer. Alternatively, the effective resistance may be varied by forming a plurality of through-holes perforating one of the electrode layers and by then adjusting the respective diameters of selected of the through-holes to vary the extent of coverage on the resistive layer. An additionally disclosed feature of the present subject matter is to incorporate dielectric layers of varied thicknesses to broaden the resonancy curve associated with a particular mutli-layer component configuration.

8 Claims, 8 Drawing Sheets

U.S. PATENT DOCUMENTS

| | | |
|---|---|---|
| 4,831,494 A | 5/1989 | Arnold et al. |
| 5,164,699 A * | 11/1992 | Smith et al. ................ 338/310 |
| 5,220,482 A | 6/1993 | Takemura et al. |
| 5,517,385 A | 5/1996 | Galvagni et al. |
| 5,576,926 A | 11/1996 | Monsorno |
| 5,599,757 A | 2/1997 | Wilson et al. |
| 5,786,978 A | 7/1998 | Mizuno |
| 5,799,379 A | 9/1998 | Galvagni et al. |
| 5,811,868 A | 9/1998 | Bertin et al. |
| 5,831,810 A | 11/1998 | Bird et al. |
| 5,880,925 A | 3/1999 | DuPré et al. |
| 5,886,867 A | 3/1999 | Chivukula et al. |
| 5,926,377 A * | 7/1999 | Nakao et al. ................ 361/763 |
| 6,023,408 A | 2/2000 | Schaper |
| 6,034,864 A | 3/2000 | Naito et al. |
| 6,038,121 A | 3/2000 | Naito et al. |
| 6,038,122 A | 3/2000 | Bergstedt et al. |
| 6,104,597 A | 8/2000 | Konushi |
| 6,184,574 B1 | 2/2001 | Bissey |
| 6,208,501 B1 | 3/2001 | Ingalls et al. |
| 6,215,372 B1 * | 4/2001 | Novak ......................... 333/12 |
| 6,226,170 B1 | 5/2001 | Nellison et al. |
| 6,243,253 B1 | 6/2001 | DuPré et al. |
| 6,370,011 B1 | 4/2002 | Naitó et al. |
| 6,407,907 B1 | 6/2002 | Ahiko et al. |
| 6,573,584 B1 | 6/2003 | Nagakari et al. |
| 6,606,237 B1 | 8/2003 | Naito et al. |

FOREIGN PATENT DOCUMENTS

| | | |
|---|---|---|
| JP | 08330187 | 12/1996 |

* cited by examiner

METHOD FOR ADJUSTING PERFORMANCE CHARACTERISTICS OF A MULTILAYER COMPONENT

PRIORITY CLAIM

This application is a divisional of U.S. patent application Ser. No. 10/234,972 filed Sep. 4, 2002, now U.S. Pat. No. 6,757,152 which claims benefit of previously filed U.S. Provisional Patent Application Ser. No. 60/317,356 filed Sep. 5, 2001, all entitled "CASCADE CAPACITOR" and having the same inventors as present.

BACKGROUND OF THE INVENTION

The present subject matter generally concerns multi-layer and cascade capacitors for use in a range of frequency applications including high frequency applications, and more particularly concerns multiple capacitor components provided in monolithic packages. The present subject matter utilizes interconnect and attachment features to create devices with improved and/or idealized performance characteristics, including high capacitance, low equivalent series inductance (ESL), and low or tunable equivalent series resistance (ESR).

The diversity of modern technical applications creates a need for efficient electronic components and integrated circuits for use therein. Capacitors are a fundamental component used for filtering, decoupling, bypassing and other aspects of such modern applications which may include wireless communications, alarm systems, radar systems, circuit switching, matching networks, and many other applications. A dramatic increase in the speed and packing density of integrated circuits requires advancements in decoupling capacitor technology in particular. When high-capacitance decoupling capacitors are subjected to the high frequencies of many present applications, performance characteristics become increasingly more important. Since capacitors are fundamental to such a wide variety of applications, their precision and efficiency is imperative. Many specific aspects of capacitor design have thus been a focus for improving the performance characteristics of capacitors.

The incredible variety of capacitor environments implies that capacitors are often subjected to a number of different operating frequencies. Many wireless communications systems, including satellite, GPS, and cellular applications, as well as high speed processor applications require capacitor technology that can accommodate high frequencies of operation. Examples of capacitor technology that are designed to accommodate a generally higher frequency range of operation are disclosed in U.S. Pat. No. 6,208,501 B1 (Ingalls et al.); U.S. Pat. No. 6,023,408 (Schaper); U.S. Pat No. 5,886,867 (Chivukula et al.); U.S. Pat No. 5,576,926 (Monsorno); and U.S. Pat No. 5,220,482 (Takemura et al.). Capacitors are often designed either for such high frequency applications or for other lower frequency applications, but not both. Thus, a need exists for capacitors with diverse capabilities that are compatible with ideal operation over a wide range of frequencies. Examples of capacitors that may operate well in some limited range of frequencies can be found in U.S. Pat. No. 6,184,574 B1 (Bissey); U.S. Pat No. 6,038,122 (Bergstedt et al.); and U.S. Pat No. 5,786,978 (Mizuno).

Just as capacitors may be subjected to different frequencies of operation, so might they be subjected to different temperatures of operation. Acceptable performance at a given temperature often relates to the temperature coefficient of capacitance of the dielectric material used to form the capacitor. An existing technique that allows for desired capacitor operation at different temperatures involves stacking capacitors formed with different dielectric materials. Examples of this stacking technique can be found in U.S. Pat. Nos. 5,799,379 and 5,517,385 (Galvagni et al.).

An actual capacitor has an inherent resistance value that may not exist in a theoretical situation. This additional property of a capacitor is often referred to as equivalent series resistance (ESR). It is desired to create a capacitor that operates as close to theoretical operation as possible, and thus capacitors with low ESR are generally preferred. The need for minimal ESR is especially evident in decoupling capacitor applications. Increased ESR can increase the ripple voltage and power dissipation for a given capacitance value. This is related to the RC time constant of a capacitor and contributes to the need for low capacitor ESR. An example of a capacitor designed to offer low ESR is disclosed in U.S. Pat. No. 6,226,170 B1 (Nellison et al.).

Another way to achieve improved capacitor performance is by lowering the inductance of the device. Thus, it is preferred for decoupling capacitors to provide low equivalent series inductance (ESL) in order to maintain circuit efficiency. It may also be preferred to implement a capacitor design that reduces the self and mutual inductance of decoupling capacitors. U.S. Pat. No. 6,038,121 (Naito et al.) and U.S. Pat. No. 6,034,864 (Naito et al.) show exemplary capacitor configurations that are designed to cancel magnetic flux and reduce ESL.

Reducing the current path will lower self inductance. Since the current often has to travel the entire length of the capacitor, termination on the longer ends of the structure will reduce the current path. If the current in adjacent capacitor electrodes flows in opposite directions it will reduce the mutual inductance in a capacitor. Multiple terminations as utilized in interdigitated capacitor technology also lower the inductance value. U.S. Pat. No. 5,880,925 (DuPré et al.) and U.S. Pat No. 6,243,253 B1 (DuPré et al.) disclose multilayer capacitors that offer some of the aforementioned lower inductance characteristics. The basic configuration discussed in these DuPré patents corresponds to a type of multilayer capacitor hereafter referred to as an interdigitated capacitor (IDC).

Another approach to lowering the ESL of a decoupling capacitor is to minimize interconnect induction that results from termination configurations and mounting systems. Certain known termination schemes are characterized by high inductance and often prohibit very close spacing between components. Thus, an efficient termination scheme is desired that has low ESL and that facilitates high component density for integrated circuits. Thin film capacitor technology is used to provide exemplary capacitors for mounting on a substrate in U.S. Pat. No. 6,104,597 (Konushi) and U.S. Pat. No. 4,439,813 (Dougherty et al.).

Known termination schemes utilize electrode plates with hole arrangements therein to connect with internal columnar electrodes. Such arrangement provides a space-saving interconnect scheme with lowered ESL, but the hole arrangements in the capacitor electrodes reduce the overall capacitance of the structure by decreasing the effective area. An excess of these clearance holes can also contribute to shorting problems as the number of layers with them increases. An example of such a termination scheme can be found in European Patent Application 1,115,129 A2 (Ahiko and Ishigara.). Thus, a need exists for a termination scheme that provides low inductance-as well as high capacitance.

There are many different performance characteristics of a capacitor for which improvement may be sought to facilitate desired operation. Selected of such characteristics as mentioned and discussed above may include low ESR, low ESL and other forms of inductance, high capacitance, broad frequency range of operation, efficient termination scheme and others. Achieving many or all of these desired characteristics in a single monolithic structure would thus facilitate a beneficial capacitive structure. While various aspects and alternative features are known in the field of capacitor technology, no one design has emerged that generally integrates all of the improved performance characteristics as discussed herein.

Exemplary background references in addition to those already cited in the specification include U.S. Pat. No. 5,831,810 (Bird et al.); U.S. Pat. No. 5,811,868 (Bertin et al.); and U.S. Pat No. 5,599,757 (Wilson et al.).

The disclosures of all the foregoing United States patents are hereby fully incorporated into this application by reference thereto.

BRIEF SUMMARY OF THE INVENTION

The present subject matter recognizes and addresses various of the foregoing shortcomings, and others concerning certain aspects of capacitor technology. Thus, broadly speaking, a principal object of the presently disclosed technology is improved capacitor performance over a wide range of frequencies. More particularly, the disclosed multi-layer and cascade capacitor embodiments offer preferred operating characteristics and a variety of flexibility over a wide frequency range.

Another object of the present subject matter is to provide multiple components and corresponding advantages thereof in an integrated capacitor package. Varied combinations of the multiple components offers flexibility in the capacitor design and resulting performance. The integrated structure may provide a plurality of stacked capacitors arranged and interconnected in parallel.

Yet another object of the subject technology is to provide capacitor configurations that accommodate a wide range of operating conditions, including desired capacitance value and frequency of operation. Preferably, possible configurations can provide a capacitance range from 0.5 µF to over 1 F and an operating frequency range from several KHz to several GHz.

A still further object of the presently disclosed technology relates to the ESR and ESL of the subject multi-layer and cascade capacitors. The embodiments disclosed herein are preferably characterized by both low ESL and low ESR. The ESR may also be tunable to a desired level in accordance with selected capacitor configurations and adjustable aspects thereof.

It is another object of the presently disclosed technology to provide a cascade capacitor whose stacked components are attached by advantageous interconnect features. Such attachment and interconnect features preferably offer low inductance and other advantages while maintaining a generally high capacitance value of the structure. The option of internal and/or external electrode connections in accordance with the present subject matter provides versatile termination configurations.

It is another object of the subject multi-layer and cascade capacitors to provide a monolithic structure that can be encapsulated in an epoxy molding to offer optional additional protection of the capacitor and any wire bonds or other connection means provided thereon.

It is yet another object of the present subject matter to optionally provide dielectric layers in multilayer portions of the subject cascade capacitor that have adjustable thickness. Different configurations can provide adjacent dielectric layers with varied thickness, thus broadening the resonance curve associated with a particular configuration.

Additional objects and advantages of the disclosed technology are set forth in, or will be apparent to those of ordinary skill in the art from, the detailed description herein. Also, it should be further appreciated by those of ordinary skill in the art that modifications and variations to the specifically illustrated, referenced, and discussed features and steps hereof may be practiced in various embodiments and uses of the disclosed technology without departing from the spirit and scope thereof, by virtue of present reference thereto. Such variations may include, but are not limited to, substitution of equivalent means and features, materials, or steps for those shown, referenced, or discussed, and the functional, operational, or positional reversal of various parts, features, steps, or the like.

Still further, it is to be understood that different embodiments, as well as different presently preferred embodiments, of this technology may include various combinations or configurations of presently disclosed features, steps, or elements, or their equivalents (including combinations of features or steps or configurations thereof not expressly shown in the figures or stated in the detailed description). A first exemplary embodiment of the present subject matter relates to a multi-layer capacitor comprising a substrate, a first electrode layer, a first insulating layer, and a second electrode layer provided in a successively stacked configuration. Electrically conductive vias are then also provided for electrical connection to selected portions of the electrode layers. The first and second electrode layers and the insulating layer all define respective pluralities of through-holes having respective diameters thereof through which the conductive vias may pass.

A variety of additional features may be incorporated with such first exemplary embodiment. One such feature corresponds to a resistive layer provided between the first insulating layer and the second electrode layer, wherein such resistive layer may also define a plurality of through-holes through which the conductive vias may pass. Yet another potential feature of such exemplary embodiment regards the substrate being characterized by an outer perimeter and the first and second electrode layers being characterized by respective substantially continuous portions and a plurality of tab portions extending from the respective continuous portions to the outer perimeter of the substrate. Still further optional features include additional insulating layers and/or solder balls attached to selected conductive vias.

A second exemplary embodiment of the present subject matter corresponds to a cascade capacitor comprising a first multi-layer capacitor, a second multi-layer capacitor and a plurality of electrically conductive lands coupling selected portions of the respective multi-layer capacitors. Each multi-layer capacitor is formed by a respective combination of electrode and insulating layers. Respective pluralities of tabs may extend from selected edges of the electrode layers. Selected layers of the first multi-layer capacitor may define through-holes through which conductive vias may pass to form electrical connections to certain electrode layers.

With further reference to such second exemplary embodiment of the disclosed technology, additional capacitors, such as for example a surface mount capacitor, a single layer capacitor, a double layer capacitor, an electrochemical capacitor, a ceramic capacitor, a tantalum capacitor, and/or selected combinations thereof, may also be coupled to conductive lands of the cascade capacitor embodiment. In more particular embodiments, a plurality of cascade capacitors may be coupled to a common capacitor. Still further particular embodiments may be formed such that the thickness among distinct insulating layers of the second multi-layer capacitor in the cascade capacitor are varied to adjust the resonance characteristics of the device.

A third exemplary embodiment of the present subject matter concerns a multi-layer capacitor comprising a plurality of electrode layers and insulating layers stacked successively, a plurality of tabs extending from selected edges of respective electrode layers and exposed on selected sides of the multi-layer capacitor, a plurality of through-holes formed by and perforating the top-most electrode layer and the adjacent underlying insulating layer, a plurality of conductive vias passing through selected through-holes, and a plurality of electrically conductive lands coupling selected of the plurality of tabs. The tabs may preferably be arranged in an interdigitated fashion, and the through-holes are preferably formed to expose the next successive electrode layer of the multi-layer capacitor.

Additional embodiments of the present subject matter equally concern methodology in forming certain aspects of the disclosed multi-layer and cascade capacitor embodiments. A first exemplary embodiment of such methodology corresponds to a method for adjusting the equivalent series resistance (ESR) of a multi-layer component. The method may comprise such steps as producing a multi-layer component including at least first and second electrode layers separated by an insulating layer, providing a resistive layer between the insulating layer and one of the first or second electrode layers, and adjusting the ESR of the component by varying the effective resistance of the resistive layer. More particularly, the effective resistance may be varied by adjusting the composition or thickness of the resistive layer. Alternatively, the effective resistance may be varied by forming a plurality of through-holes perforating one of the electrode layers and by then adjusting the respective diameters of selected of the through-holes to vary the extent of coverage on the resistive layer.

A further exemplary embodiment of methodology in accordance with the present subject matter relates to a method of adjusting the resonance characteristics of a multi-layer component. Such method preferably comprises the steps of producing a multi-layer component having a plurality of successively stacked electrode layers, providing separate insulating layers sandwiched between each of the electrode layers, and varying the thickness among selected of the separate insulating layers whereby the resonance characteristics of the multi-layer component are adjusted. Such varying step may be accomplished for example with continuous thickness variation, with patterned thickness variation, and/or with matched variable thickness variation among layers.

Additional embodiments of the present subject matter, not necessarily expressed in this summarized section, may include and incorporate various combinations of aspects of features or parts referenced in the summarized objectives above, and/or features or parts as otherwise discussed in this application.

Those of ordinary skill in the-art will better appreciate the features and aspects of such embodiments, and others, upon review of the remainder of the specification.

BRIEF DESCRIPTION OF THE DRAWINGS

A full and enabling description of the presently disclosed technology, including the best mode thereof, directed to one of ordinary skill in the art, is set forth in the specification, which makes reference to the appended figures, in which:

FIG. 1B displays an exemplary embodiment of the subject cascade capacitor technology, comprising a thin film BGA component such as that displayed in FIG. 1A and an interdigitated capacitor (IDC) component;

FIGS. 2A and 2B relate to a second exemplary embodiment of the present subject matter; in which FIG. 2A illustrates a partially exploded view of a second exemplary embodiment of the subject capacitor technology;

FIG. 2B displays a detailed view of a second exemplary embodiment of the present subject matter, such as that illustrated in FIG. 2A;

FIGS. 6B, 6C, 6D and 6E, respectively, correspond to exemplary multilayer capacitor arrangements with dielectric layers having varied thickness;

Figure 1A:
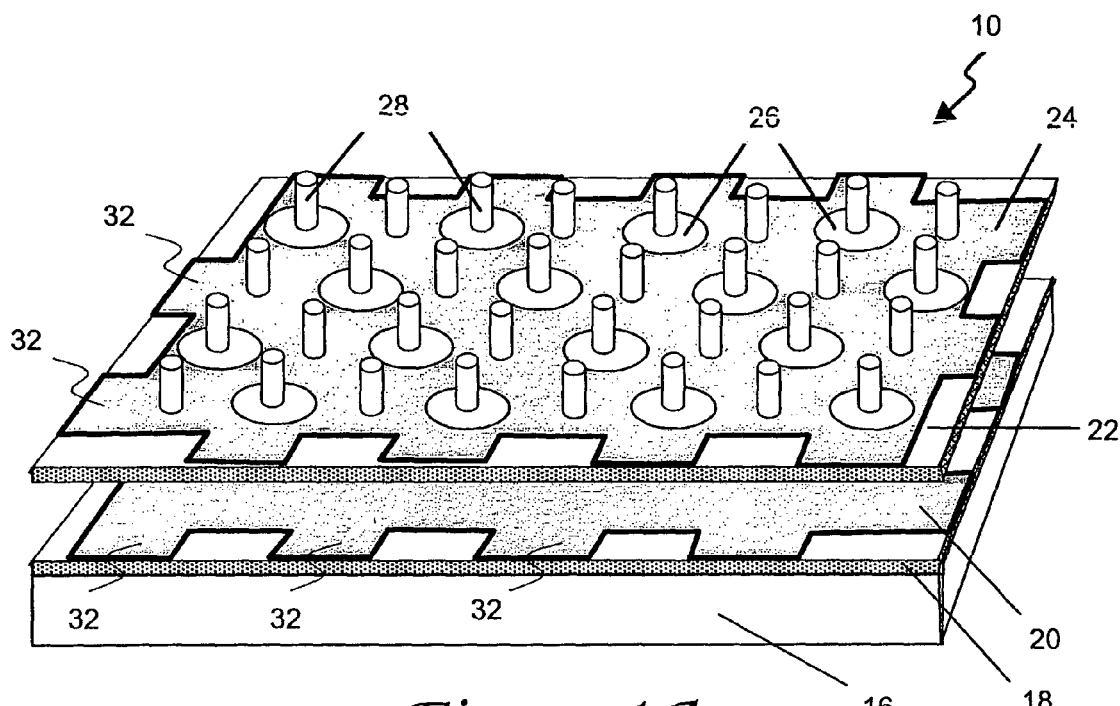
FIGS. 1A and 1B relate to a first exemplary embodiment of the present subject matter; in which FIG. 1A displays a partially exploded view of an exemplary thin film ball grid array (BGA) capacitor configuration for use in accordance with certain embodiments of the present subject matter.

Repeat use of reference characters throughout the present specification and appended drawings is intended to represent same or analogous features or elements of the disclosed technology.

DETAILED DESCRIPTION OF THE DRAWINGS

As referenced in the Brief Summary of the Invention section, supra, the present subject matter is directed towards improved capacitor performance over a wide range of frequencies. More particularly, the disclosed cascade capacitor preferably offers large capacitance, low ESL and/or tunable ESR over a wide frequency range of operation.

The subject cascade capacitor may comprise multiple components that are provided in an integrated capacitor package. Exemplary cascade capacitors may comprise many different components, including thin film BGA capacitors, IDC structures, single layer capacitors, double-layer electrochemical capacitors, surface mount tantalum capacitors, multilayer capacitors (MLCs) and others. Alternatively, certain aspects of selected capacitor components may be combined to form a single monolithic capacitor structure. Preferred embodiments of the subject technology incorporate aspects of at least two of these components into their integrated structure.

Two preferred components are thin film BGA capacitors, such as that illustrated in FIG. 1A, and interdigitated capacitors (IDCs). Thin film BGA techniques offer low ESL and tunable ESR, and offer a means for attaching to an electronic printed wire board (PWB) or ceramic package. A first exemplary embodiment comprises an IDC style component for electrically connecting in parallel with a thin film BGA device, such as displayed in FIGS. 1B and 3A. Such exemplary combination provides a cascade capacitor with two levels of decoupling.

Figure 2A:
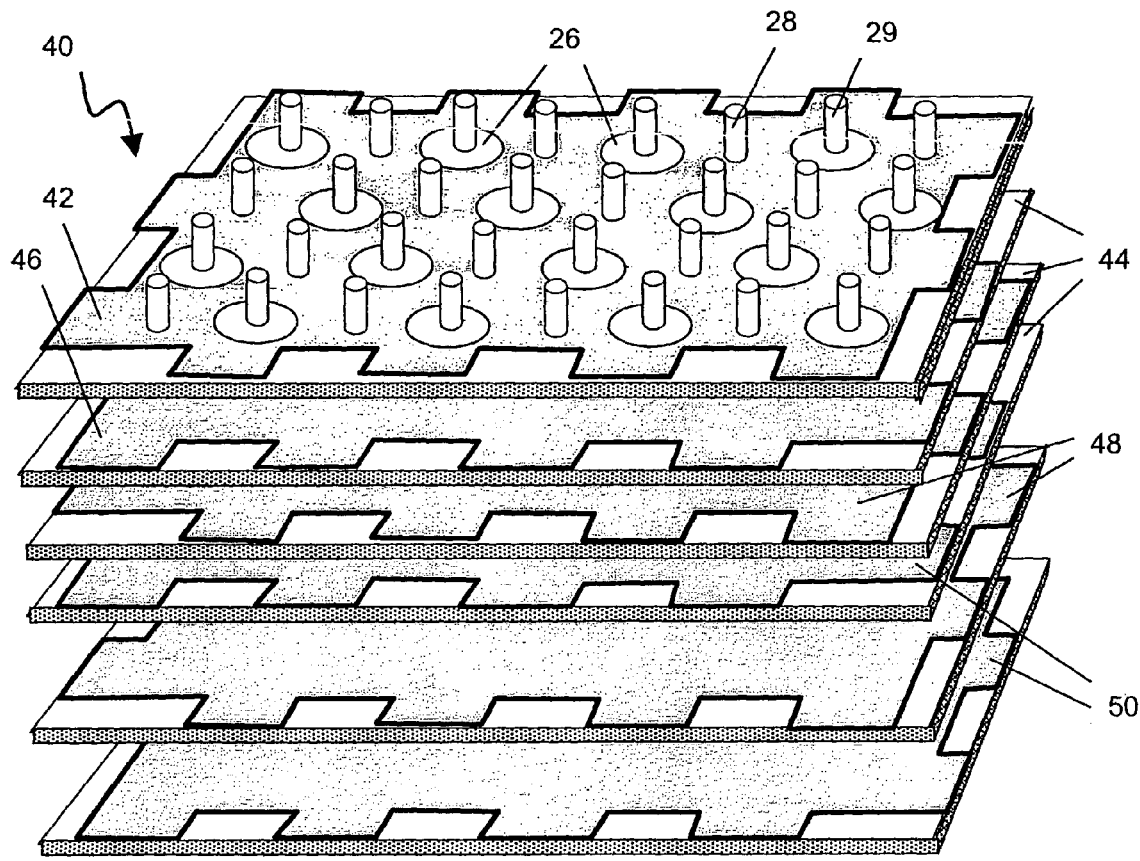
Figure 2B:
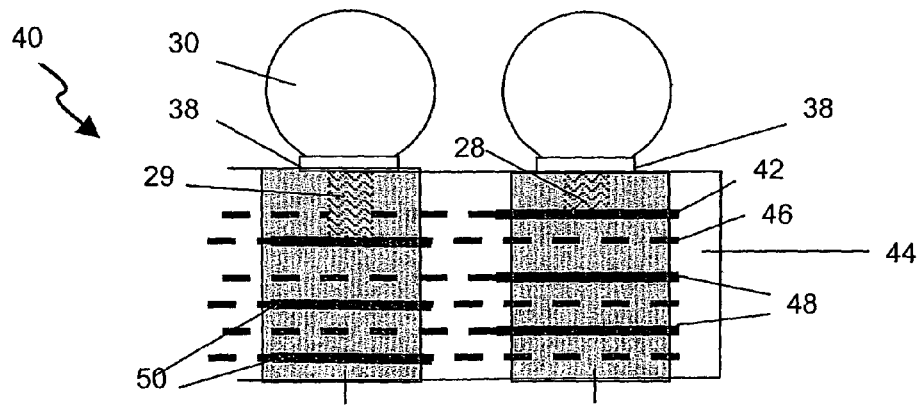
Figure 3A:
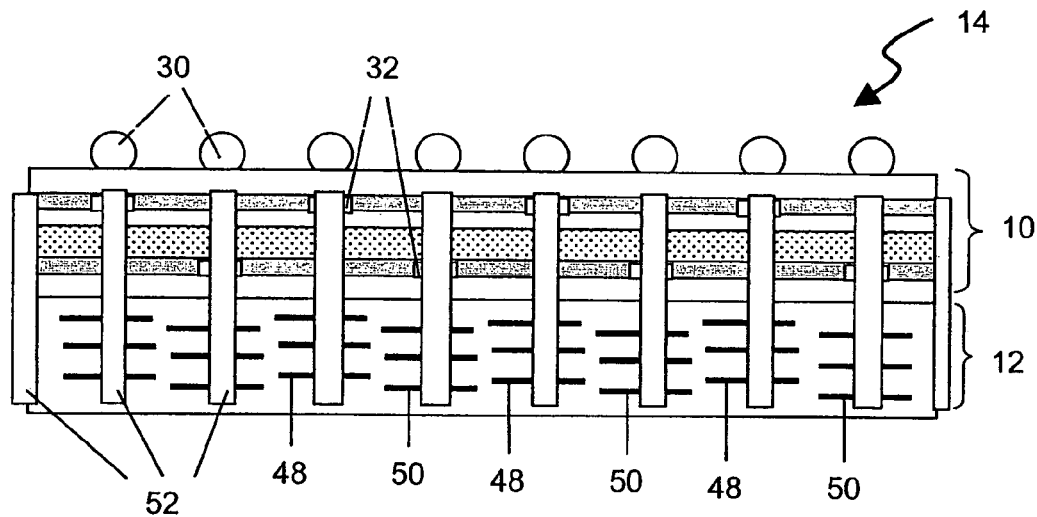
FIGS. 3A through 3C, respectively, show varied illustrations of exemplary embodiments of the subject cascade capacitor technology.
Figure 3B:
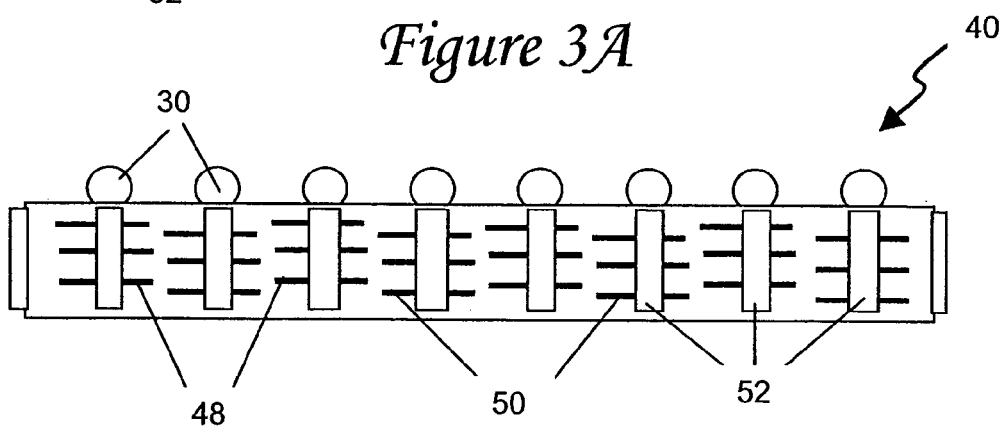

A second exemplary embodiment of a cascade capacitor in accordance with the present disclosure that offers similar decoupling capabilities is a thick film construction that incorporates BGA techniques into the top layer of an IDC, such as disclosed in FIGS. 2A, 2B and 3B. This and other exemplary cascade capacitor configurations can provide broadband decoupling over a frequency range from kilohertz up to a gigahertz. Possible capacitance values for selected configurations might range from about 0.5 μF to about 50 μF for a single thin film BGA/IDC combination.

Figure 4A:
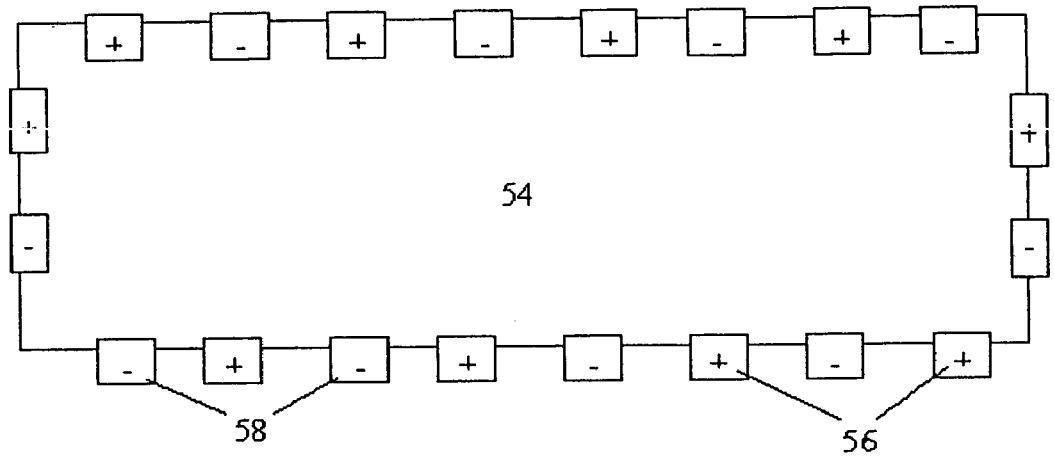
FIGS. 4A and 4B display exemplary embodiments of the present subject matter, with a focus on exemplary termination features.
Figure 4B:
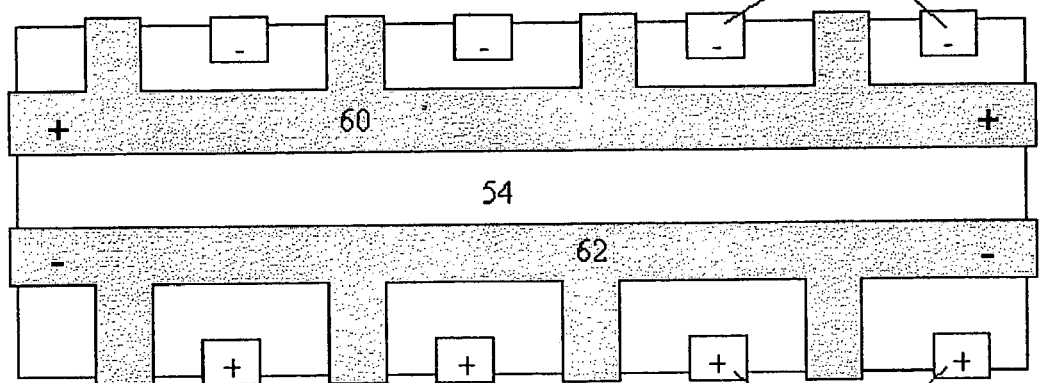

FIGS. 4A and 4B illustrate an exemplary termination scheme for selected embodiments of the present subject matter. Such a termination arrangement allows for electrical connection of additional components with the selected embodiments. Such additional components for combination with either of the aforementioned first or second exemplary embodiments may include surface mount tantalum capacitors, multilayer capacitors or single layer capacitors.

Figure 5A:
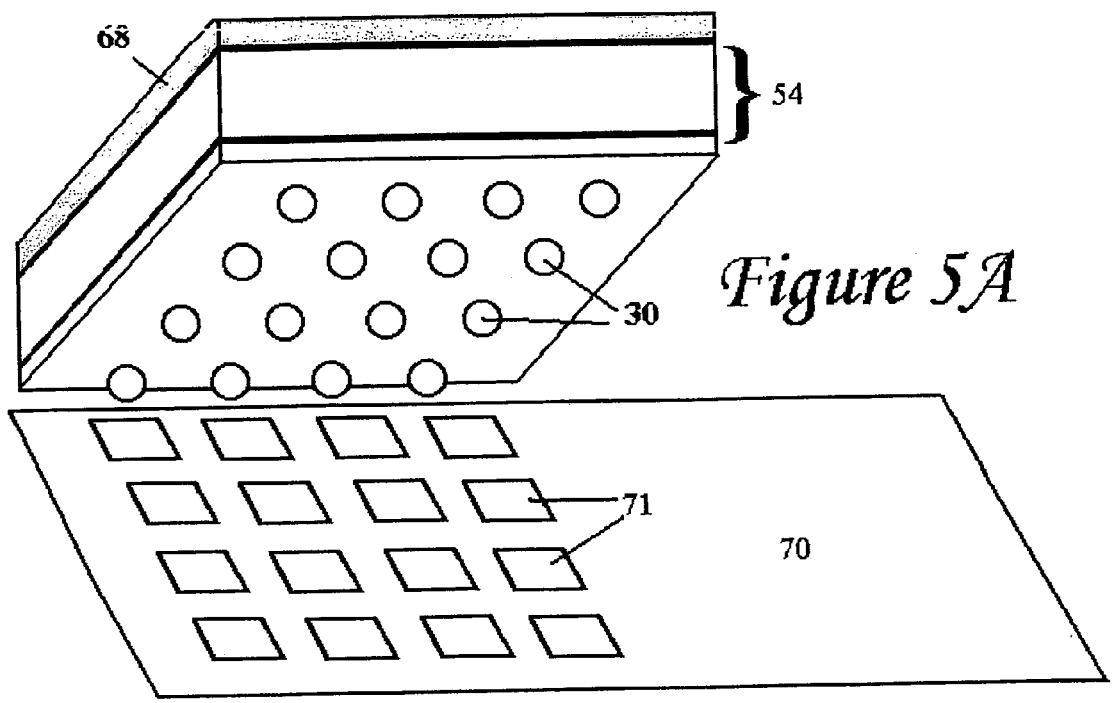
FIG. 5A illustrates an exemplary cascade capacitor of the present technology with means for mounting on a printed wire board or other appropriate surface.
Figure 5B:
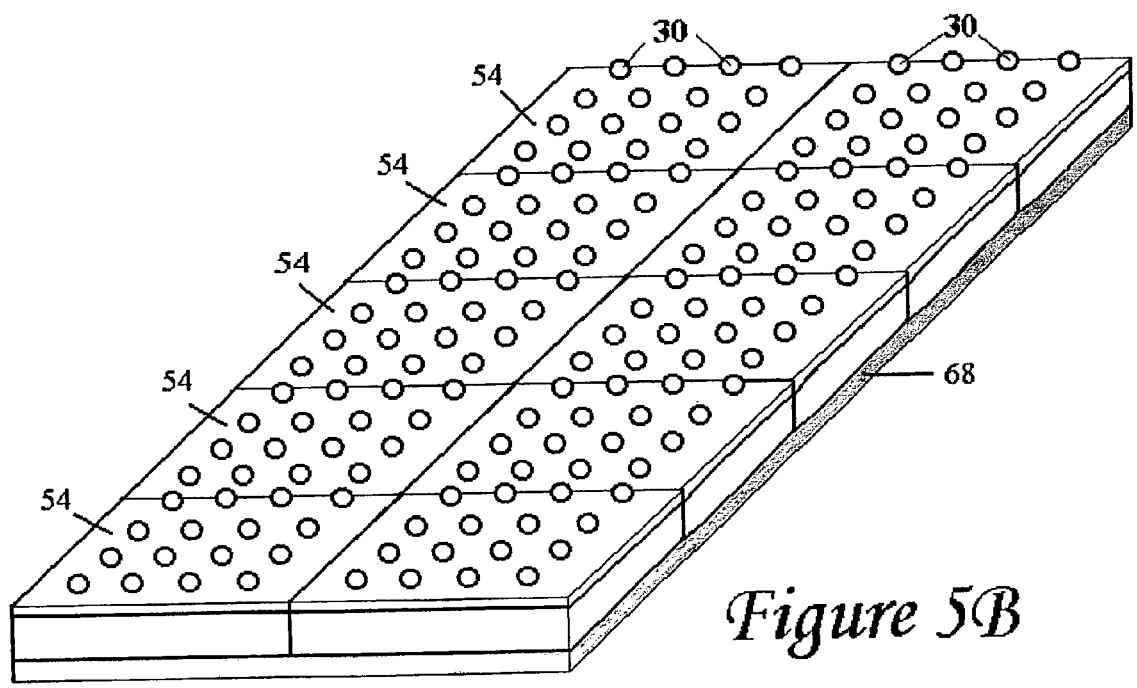
FIG. 5B depicts an exemplary cascade capacitor with multiple levels of cascaded structures in accordance with the present subject matter.

FIG. 5A illustrates another exemplary embodiment of the subject cascade capacitor technology, with a focus towards exemplary features for attaching such an embodiment and other embodiments to a printed wire board or other appropriate surface. FIG. 5B displays yet another exemplary embodiment of the present subject matter that incorporates either of the aforementioned first or second exemplary embodiments or others with a single electrochemical capacitor to create a cascade capacitor with increased overall capacitance.

Figure 6A:
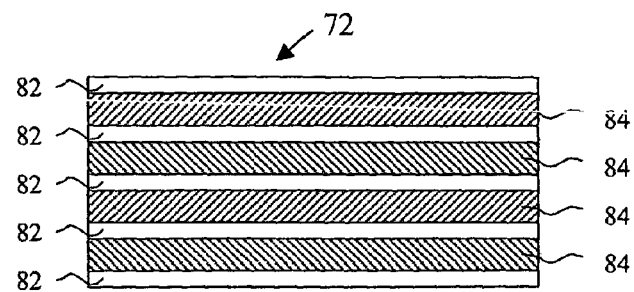
FIGS. 6A through 6E represent exemplary configurations for multilayered portions of the subject cascade capacitor designs; in which FIG. 6A corresponds to an exemplary multilayer arrangement with dielectric layers having fixed thickness.
Figure 6B:
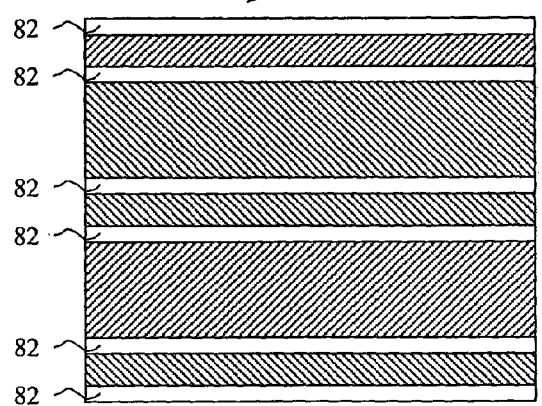
Figure 6C:
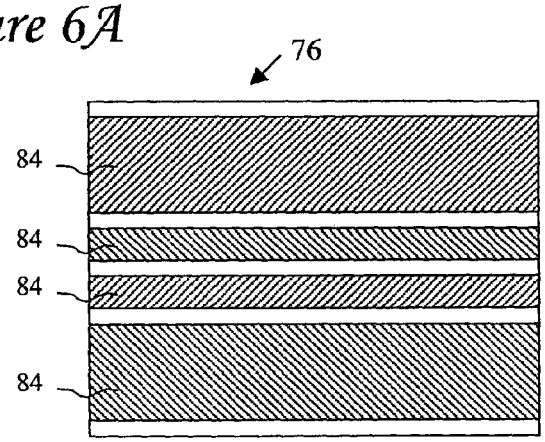
Figure 6D:
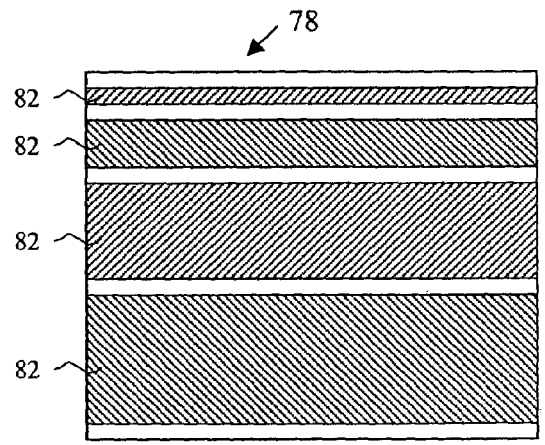
Figure 6E:
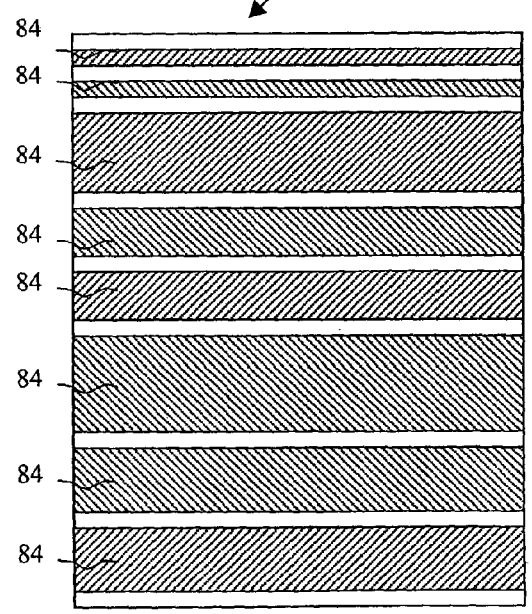
Figure 7:
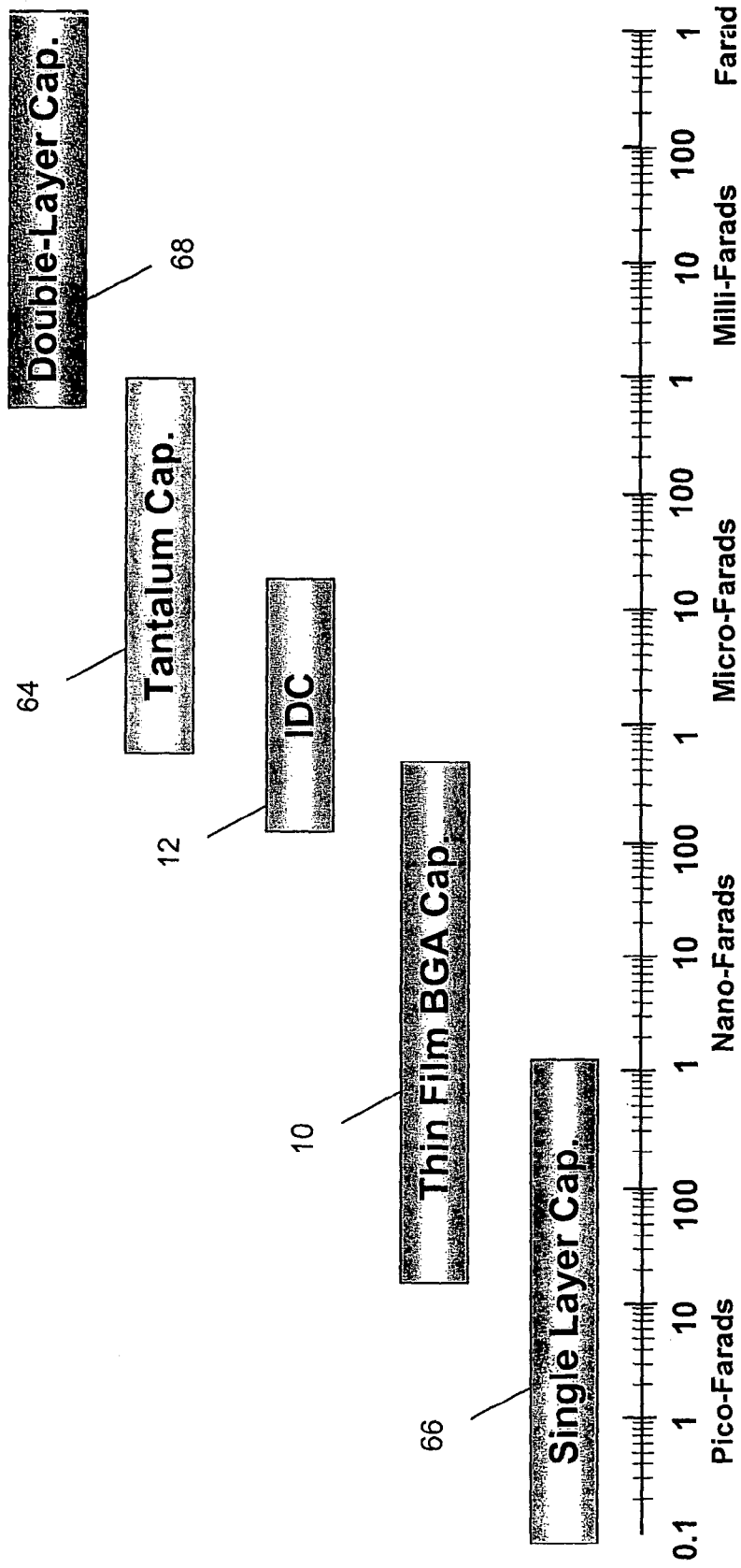
FIG. 7 illustrates an exemplary range of capacitance values available for selected combinations of components in accordance with the subject cascade capacitor technology.
Figure 8A:
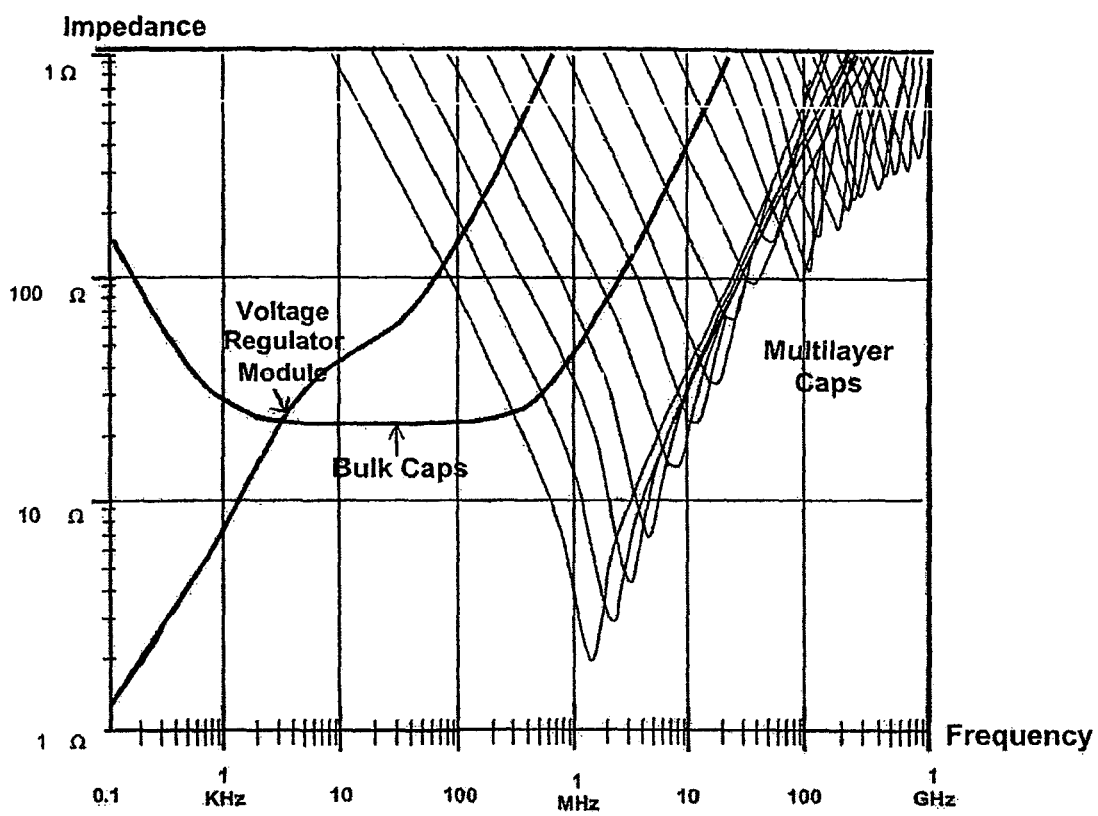
FIGS. 8A and 8B display exemplary impedance curves corresponding to selected embodiments of the present subject matter.
Figure 8B:
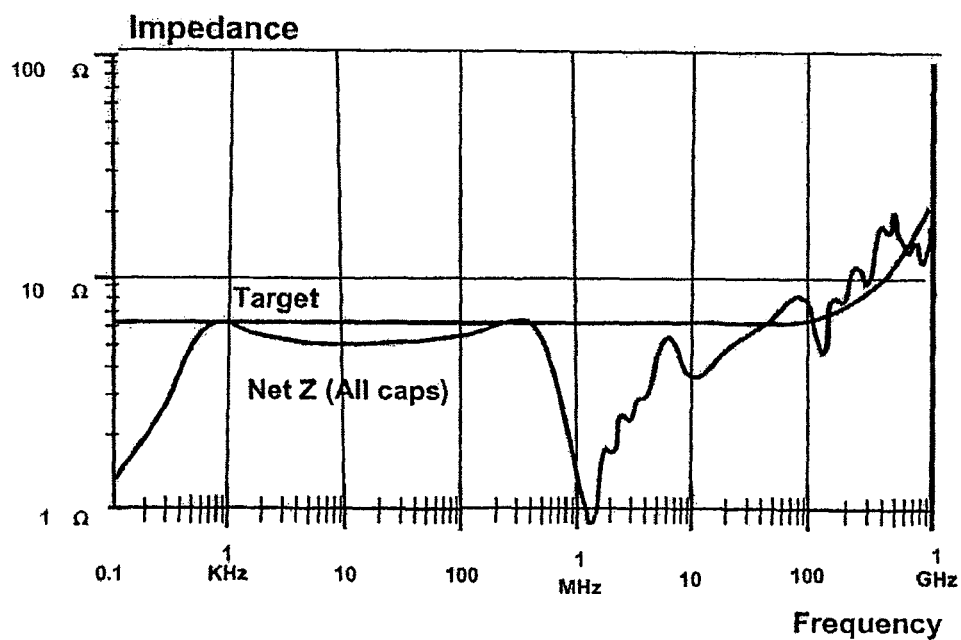

FIGS. 6A through 6E, hereafter collectively referred to as FIG. 6, display varied configurations of dielectric layers and electrode layers for application in accordance with multilayer portions of the subject cascade capacitors. FIG. 7 illustrates general capacitance ranges that may be available for selected capacitor components and combinations thereof. FIGS. 8A and 8B display impedance curves that help illustrate selected performance characteristics associated with selected embodiments of the present subject matter.

It should be noted that each of the exemplary embodiments should not insinuate limitations of the present subject matter. Features illustrated or described as part of one embodiment may be used in combination with aspects of another embodiment to yield yet further embodiments. Additionally, certain features may be interchanged with similar devices or features not expressly mentioned which perform the same or similar function.

It should be appreciated that the figures are not drawn to scale. Also, it should be appreciated that selected elements of each figure may not be represented in proportion to other elements in that figure. In addition, materials that are listed as exemplary substances for forming certain elements of the embodiments as discussed herein are merely presented as examples, and should in no way limit the specific composition of the capacitor embodiments. It should be appreciated that as newly improved materials are designed and/or created, incorporation of such substances with the technology disclosed herein will be anticipated.

Reference will now be made in detail to the presently preferred embodiments of the subject cascade capacitor technology. Referring now to the drawings, FIGS. 1A and 1B relate to a first exemplary cascade capacitor embodiment. FIG. 1A illustrates a thin film BGA capacitor component 10 for use in accordance with selected embodiments of the subject cascade capacitor technology. A substrate 16 is provided onto which a first insulating layer 18 is deposited. Examples of suitable substances that might be used to form substrate 16 include silicon, glass ceramic, alumina, aluminum nitride, silicon carbide, zinc oxide, $BaTiO_3$, varistor ceramics, perovskite ceramics, oxide ceramics, non-oxide ceramics, or other high temperature inert materials. Selected of the above-listed suitable substrate materials that may be preferred for use in selected applications include glass, glass ceramic, or silicon wafer. A suitable material may also be selected for insulating layer 18, also sometimes referred to as a planarization layer. A buffer type of insulation layer may be preferred for use with substrate materials having resistive, semi-conductive or conductive characteristics. Other particular materials may be chosen to use in conjunction with generally rough substrate materials. An example of a preferred combination of substrate 16 and insulation layer 18 is a silicon-based substrate with a silicon dioxide insulating layer.

A bottom electrode layer 20 is arranged above the insulating layer 18. Examples of suitable substances that might be used to form bottom electrode layer 20 include platinum, gold, nickel, palladium, ruthenium, iridium, ruthenium oxide, iridium oxide, other suitable conductive materials, or a combination or alloy of selected of the above-references substances. Selected of the above-listed suitable materials for forming a bottom electrode layer in accordance with the present subject matter that may be preferred for use in certain applications may correspond to platinum, gold or nickel. Some combinations of selected materials for use in forming BGA component 10 and/or other embodiments of the present subject matter require an adhesion layer in between insulating layer 18 and bottom electrode 20. Such an adhesion layer (unlabeled) may comprise such exemplary substances as titanium dioxide, titanium, tantalum, chromium, tantalum nitride, titanium nitride, nichrome, titanium/tungsten, or magnesium. A suitable adhesion layer may also preferably be formed of titanium dioxide from oxidation of sputtered titanium or reactive sputtering of titanium in oxygen to form titanium dioxide.

A series of tabs 32 extends from around the edges of electrode layer 20 such that each tab 32 extends to an outer surface of BGA component 10. A dielectric layer 22 is placed over bottom electrode layer 20, with some embodiments utilizing an optional conductive oxide buffer layer (unlabeled) in between the dielectric layer 22 and bottom electrode layer 20. Examples of suitable substances that might be used to form dielectric layer 22 include $PbZrTiO_3$ (also referred to as PZT), PNZT, PLZT, PbMg$_{1/3}$Nb$_{2/3}$O$_3$—PbTiO$_3$ (also referred to as PMN—PT), SrBaTiO$_3$, BaTiO$_3$, SrTiO$_3$, Bi$_2$SrTa$_2$O$_9$, polycrystalline ceramic perovskites, polycrystalline relaxor ferroelectric ceramic oxides, silicon dioxide, Si$_3$N$_4$, silicon oxynitride, Al$_2$O$_3$, Ta$_2$O$_5$, polycrystalline tungsten bronzes, polycrystalline bismuth titanates, and other suitable dielectric materials. PZT and PNZT are commonly employed as a preferred dielectric material for selected applications.

A top electrode layer 24 is applied, also with tabs 32 generally extending to the edges of component 10. Examples of suitable substances that may be used for forming top electrode 24 include copper, nickel, aluminum, palladium, gold, silver, platinum, lead, tin, select combinations of the aforementioned elements, or other suitable conductive substances. A barrier layer 34 is preferably provided between the dielectric layer 22 and top electrode layer 24. Properties of layer 34 ensure that BGA component 10 is characterized by generally lower leakage currents and more reliability. This latter feature is typically enabled by the fact that the thickness of the resistive barrier layer 34 and/or the extent of coverage of the top electrode 24 can be easily adjusted, providing a tunable and controlled internal resistance. A generally small but tunable ESR may often be more desirable than negligible ESR in a capacitor component to avoid potential ringing in the resultant circuit. Layer 34 offers further advantages to a capacitor embodiment of the present technology. Such advantages may include preventing diffusion of the metal electrode layers into a dielectric or other layer, reducing the chance of shorting or conduction through a dielectric substance, promoting adhesion of an electrode, altering the polarity of a capacitor device, or promoting self-heating of a device. Examples of substances commonly employed in resistive barrier layers 34 include titanium, tantalum, chromium, titanium nitride, titanium/tungsten, tungsten, magnesium and others as readily understood and appreciated in the art. Examples of other substances that may be preferred for use in certain embodiments of barrier layer 34 include tantalum nitride, nichrome, chromium silicide, and other resistive compounds.

A second insulating layer 36, also commonly referred to as a passivation layer is then applied to the top electrode layer 24. Such passivation layer 36 protects the underlying capacitor layers and helps provide electrical stability of the component. Exemplary suitable materials for passivation layer 36 may be selected from thin films of inorganic materials such as silicon nitride (Si$_3$N$_4$), silicon dioxide (SiO$_2$), silicon oxynitride (SiON, and various nonstoichiometric combinations designated as Si$_v$H$_w$C$_x$O$_y$N$_z$. Alternatively, passivation layer 36 may be made from various films of organic polymers including polyimides, epoxies, or benzocyclobutene (BCB), as well as combinations of layers of inorganic and organic materials.

Top electrode layer 24 has an array of circular openings 26 to provide non-contact holes for connection paths to the bottom electrode 20. A similar array of holes is provided in resistive barrier layer 34. By making the holes 26 in conductive layer 24 larger than the respective holes in resistive barrier layer 34 (as in FIG. 1B), additional portions of resistive barrier layer 34 are exposed. More exposure of resistive barrier layer 34 increases the ESR of the device, exemplifying the tunable resistance of selected cascade capacitor configurations. Conductive vias 28 and 29 are inserted into capacitor component 10 with adjacent contacts alternating between top electrode 24 and bottom electrode 20. Solder balls 30 may then be attached to the respective ends of conductive vias 28 and 29 to provide termination features. Once all layers are deposited on the substrate 16, a thin film BGA component 10 is effected.

A first embodiment 14 of the present subject matter comprises a thin film BGA component 10 and a multilayer IDC component 12. By combining the ultra-low ESL, high frequency performance characteristics of BGA component 10 with the greater capacitance of IDC component 12, the frequency range of useful decoupling functionality is expanded. Thin film BGA techniques may be utilized with components other than multilayer IDCs to form additional cascaded structures.

A typical IDC may correspond to a multilayer arrangement of electrode layers and dielectric layers. A partially exploded view of such a multilayer arrangement is shown in FIG. 2A. Electrode layers are preferably arranged in parallel with tabs 48 and So extending from the layers such that electrode tabs extending from alternating electrode layers are aligned in respective columns. Such an arrangement of interdigitated terminals provides an electrode configuration with generally low ESL. Current preferably travels along the shorter distance of a chip component, thus lowering the self inductance of the device. The electrode arrangement of an IDC is such that current flowing out of a first set of positive plates returns in the opposite direction along a negative set of adjacent plates. Such provision of current flows in opposing directions considerably reduces inductance created by adjacent current flow in the same direction.

FIG. 3A displays cascade capacitor embodiment 14 with features for connecting BGA component 10 with IDC component 12. Lands 52 may be provided along selected sides of the components to connect the terminations created by tabs 32 as well as IDC tabs 48 and 50. Alternatively, two sets of lands 52 may be provided, one set for BGA component 10 and one set for IDC component 12. These two sets of lands may then be mated to form a unified set of side terminations, such as displayed in FIG. 3C. The process of applying outside lands is effected through relatively simple techniques known to those of ordinary skill in the art of capacitor technology. Other termination features include solder balls 30 or other solder elements that may be applied to conductive vias 28 and 29. Examples of materials for forming solder balls 30 might include tin lead alloys, tin copper silver alloys, tin copper alloys, tin silver alloys, tin bismuth alloys, tin silver bismuth alloys, tin silver bismuth copper alloys, tin antimony alloys, tin silver copper antimony alloys, and other suitable substances. It is often preferred to add an optional under bump metallurgy beneath solder balls 30 to help control the flow of the solder material 30. FIG. 2B displays the relative position of such ball limiting metallurgy (BLM) 38 to an exemplary embodiment of the present technology. Exemplary substances for use as BLM 38 may correspond to copper, nickel, gold, silver, tin lead, alloys formed from combinations of selected of the aforementioned metallic elements, and other combinations of conducting metals with a solderable surface. Exemplary particular BLM materials that may be preferable for certain applications include nickel-gold layers or copper-nickel-gold layers. Solder elements 30 can then be more conveniently applied to embodiments of the disclosed technology and subsequently utilized for connecting cascade capacitor embodiments to a PWB.

Figure 1B:
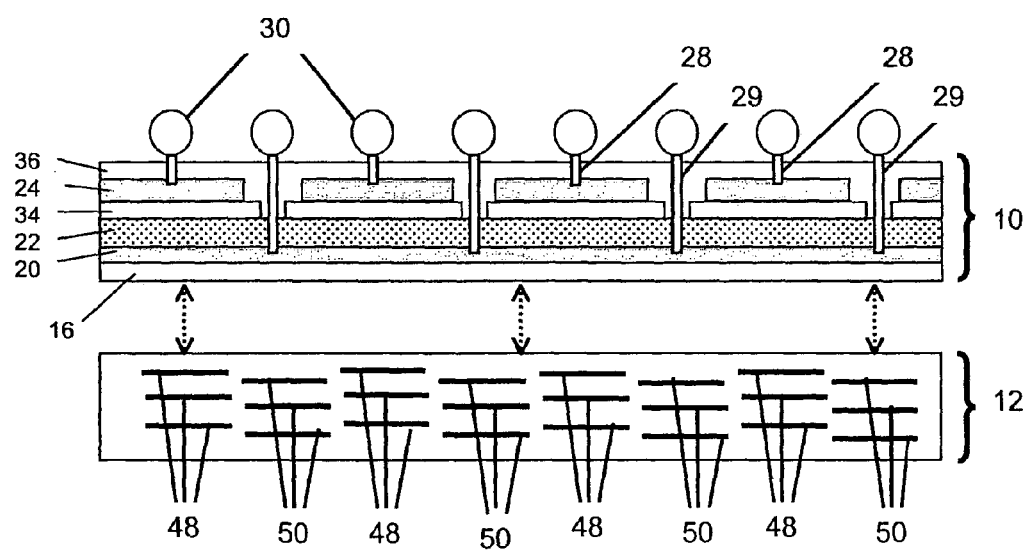

FIGS. 2A, 2B and 3B relate to a second exemplary embodiment of the present subject matter that offers similar electrical properties to the first exemplary embodiment as discussed with reference to FIGS. 1A and 1B. This second embodiment 40 builds a thick film version of a BGA component into the top layer of an IDC style capacitor such as 12. A first set of electrode layers and corresponding tabs 48 form a set of terminals characterized by a given polarity and a second set of electrode layers and corresponding tabs 50 form a set of terminals with opposite polarity than the polarity of electrodes 48. Dielectric layers 44 are provided between adjacent electrode layers to form exemplary cascade capacitor 40. The top electrode layer 42 has an array of holes 26 enabling non-contact paths to the second electrode 46 which is counter to first electrode 42. Conductive via attachments 28 and 29 are then employed for providing alternating connections to the top two electrode layers. In the detailed perspective of FIG. 2B, via 28 connects to electrode layer 42 and via 29 connects to electrode layer 46. Electrode layers below the top two layers are preferably connected with typical side termination lands 52.

Figure 3C:
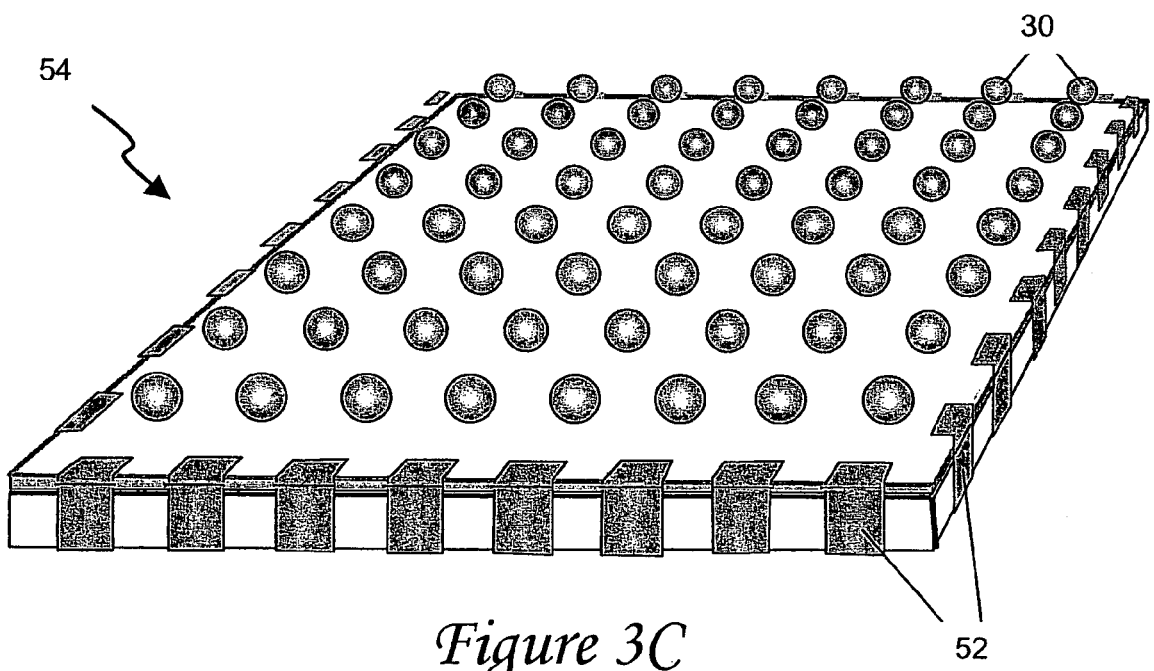

There are many different types of electrode termination that may be utilized in accordance with presently disclosed cascade capacitor embodiments. If lands 52 are provided that wrap around the top and bottom surfaces of a capacitor, such as depicted in FIG. 3C, then the selected sides can be coated with glass or organic solder-stop. A modified application of BLM is thus effected, and solder elements 30 can be reflowed to provide a columnar structure of solder that serves to mount the embodiment and provide a stress absorbing standoff, while keeping the sides of the capacitor free from termination structures. Alternatively, internal vias could connect the tabs 48 and 50 thus precluding the need for external lands. Thus, the option of utilizing internal or external via interconnection facilitates a variety of exemplary cascade capacitor configurations.

Referring again to FIGS. 2A and 2B, an insulating layer may then preferably be deposited onto top electrode layer 42. Further addition of solder balls 30 and BLM 38 to columnar vias 28 and 29 effects a cascade capacitor configuration 40 such as that displayed in FIG. 2B.

The termination scheme utilized in exemplary embodiment 40 (FIGS. 2A, 2B and 3B) and exemplary embodiment 14 (FIG. 3A) provide many advantages. The disclosed embodiments do not require the holes 26 and vias 28 and 29 to cut through all the electrode layers of the capacitor. It is known that capacitance of a component is directly proportional to the area of its capacitor plates. Holes throughout the capacitor body would thus decrease the effective capacitance and reduce the reliability of the device. Selected termination schemes of the present embodiments are more cost efficient than other termination schemes and preferably will not decrease the overall capacitance value of a cascade capacitor design. It is recognized that internal connection with holes and vias to many electrode layers in an exemplary embodiment would create a complex termination arrangement, but one that is characterized by generally low inductance. On the other hand, it is also recognized that internal connection to only a small number of electrode plates, such as displayed in FIG. 1B and FIG. 2B, provides quite a reliable internal termination arrangement. However, it is characterized by lowered capacitance. Thus, there is an evident tradeoff among the complexity, capacitance, inductance, and reliability of the termination arrangement of the present subject matter. Selected of these characteristics may be more desirable for certain applications, and thus it should fall within the scope of the presently discloses technology that variations to the number of electrode layers that are internally connected are available.

FIGS. 3A through 3C display exemplary cascade capacitor embodiments such as those described in the foregoing specification. FIG. 3A illustrates a view of all elements in combination to form first embodiment 14 of a thin film BGA/IDC cascade capacitor. FIG. 3B illustrates second exemplary embodiment 40 of a thick film BGA/IDC cascade capacitor. It should be appreciated that various features discussed above in reference to one exemplary embodiment may still be applied to other embodiments of the present subject matter. More particularly, optional layers and features described with respect to embodiment 14 or other embodiments can be applied to embodiment 40 or other embodiments, and vice versa, while still remaining within the scope of the presently disclosed technology. FIG. 3C displays an exemplary embodiment 54 that represents either embodiment 14 or 40. For the remainder of the specification, it will be understood that BGA/IDC component 54 could correspond to either the thin film cascade capacitor structure 14 or the thick film monolithic cascade capacitor embodiment 40.

Referring to FIGS. 4A and 4B, additional termination features for an exemplary cascade capacitor 54 are displayed. A unified positive termination bar 60 is provided that connects selected of the positive termination lands 56 together. A unified negative termination bar 62 is also provided to connect selected of the negative termination lands 58 together. Termination bars 60 and 62 facilitate the connection of additional components to exemplary cascade capacitor 54. Such termination elements 60 and 62 can be screen-printed or defined using direct write based techniques or other techniques known in the art.

Figure 4C:
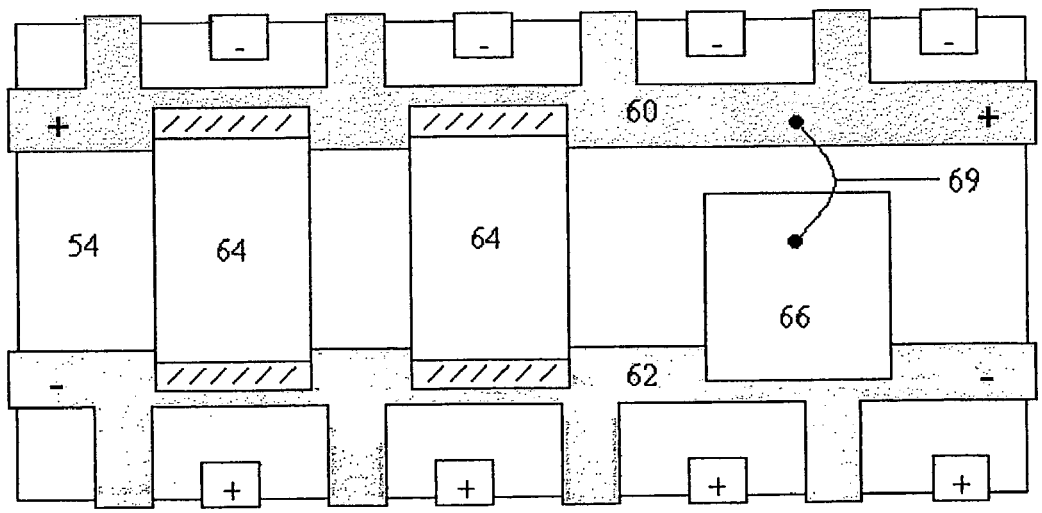
FIG. 4C illustrates an exemplary embodiment of the present subject matter with selected additional components connected in parallel to form a yet further embodiment of a cascade capacitor in accordance with the presently disclosed technology.

Another embodiment of the subject cascade capacitor technology is displayed in FIG. 4C and comprises two surface mount tantalum or ceramic capacitors 64 arranged beside a single layer capacitor 66 and electrically connected to a BGA/IDC component 54 in accordance with the presently disclosed technology. Inclusion of such a tantalum device 64 preferably extends the range of potential capacitance values of selected embodiments of the subject technology. Small surface mount tantalum capacitors preferably offer high energy storage, high frequency of operation and desired ESR performance. An example of a surface mount tantalum capacitor 64 for use in accordance with the subject technology is a TACmicrochip brand tantalum capacitor, such as that offered for sale by AVX Corporation. Single layer capacitor (SLC) 66 preferably utilizes thin film techniques to provide an exemplary capacitor for dependable functionality into the GHZ frequency range. Exemplary single layer capacitors for use in accordance with the present subject matter may comprise a thin-film layer of gold metallization applied to a ceramic dielectric with varied range of capabilities. An alternate use example of a single layer capacitor 66 for use in accordance with the subject technology is an Accu-P brand capacitor, such as that offered for sale by AVX Corporation.

A single layer capacitor 66 may be connected to cascade capacitor embodiment 54 as depicted in FIG. 4C. A bottom electrode of single layer capacitor 66 is attached to a selected termination bar 62 and a top electrode is wire bonded with one or more wire bonds 69 to the other termination bar 60. The provision of termination elements 60 and 62 facilitates the connection of surface mount tantalum or multilayer ceramic capacitors 64 to embodiment 54. The final cascade configuration of FIG. 4C and other exemplary embodiments that contain single layer capacitors 66 are preferably encapsulated with a molding compound of epoxy or other suitable material to protect any wire bonds used for attaching distinct capacitor components.

A still further exemplary embodiment of the present subject matter comprises a BGA/IDC component 54 attached to a single surface mount tantalum capacitor 64.

Additional embodiments may comprise at least two surface mount tantalum capacitors in parallel with cascade embodiment 54. Such tantalum capacitors may be arranged similar to the embodiment displayed in FIG. 4C without single layer capacitor 66. Other exemplary embodiments of the present technology might comprise a BGA/IDC component 54 in combination with at least one single layer capacitor and without tantalum capacitors.

FIG. 5A displays an exemplary cascade capacitor in accordance with the present subject matter, featuring a tantalum capacitor, a single layer capacitor, or an electrochemical capacitor 68 as one of its components. An electrical double-layer capacitor 68 is mounted and electrically connected in parallel with BGA/IDC component 54. Solder balls 30 are attached to the BGA/IDC component for connecting the cascade capacitor to a ceramic package or PWB. Due to the size of many double-layer capacitors 54, it is often convenient to connect multiple BGA/IDC components 54 in parallel with a single electrochemical component 68, such as displayed in FIG. 5B. The exemplary embodiment of FIG. 5B displays ten BGA/IDC components 54 arranged side-by-side on top of a single electrochemical capacitor 68.

The inclusion of an electrochemical capacitor in exemplary cascade capacitor configurations enables a cascade capacitor with exceptionally high capacitance value, typically about 0.1 Farad or greater. A typical electrochemical capacitor includes hydrogen ions that line up to form an electrochemical layer that functions as a dielectric. The resulting structure offers very high capacitance and ultra low ESR in the milli-ohm (mΩ) region. Some double-layer capacitor configurations only have two terminals associated with the component. Thus, to connect such an electrochemical device 68 with a BGA/IDC component 54, termination elements 60 and 62 such as displayed in FIG. 4B may preferably be utilized. Positive polarity terminations of BGA/IDC component 54 are gathered and connected to a first termination bar and negative polarity terminations are gathered and connected to a second termination bar, each termination bar being respectively connected to terminations of the electrochemical capacitor 68. The thermally sensitive nature of electrochemical capacitors 68 yields a preferred connection method between the electrochemical component and other components of conductive epoxy or a mechanical fastener as opposed to solder reflow.

With reference to FIG. 5A, an exemplary position for mounting selected cascade capacitor configurations is presented. Solder balls 30 or other solder element may typically be mounted to the BGA style termination portion of structure 54. Solder balls 30 may be applied to corresponding attachment pads 71 on printed wire board (PWB) 70. Attachment pads 71 may be arranged in a variety of ways to accommodate circuit connections. Respective pad and solder bump arrangements can also be utilized to connect distinct components within a cascade capacitor configuration.

An advantage of certain exemplary embodiments of the subject cascade capacitor technology is improved resonancy characteristics that result from varying the thickness of dielectric layers present in such exemplary embodiments, and particularly in accordance with IDC components of such exemplary embodiments. A normal pattern of interleaved dielectric layers 84 and electrode layers 82 is displayed in arrangement 72 of FIG. 6A. Such arrangement 72 with dielectric layers 84 of a fixed thickness results in low impedance over a generally narrow range of frequencies. Configurations that incorporate dielectric layers 84 with varied thicknesses help to broaden the frequency range that a capacitor exhibits preferred impedance characteristics. Arrangement 74 of FIG. 6B provides dielectric layers 84 of continuously varying thickness. Exemplary arrangements 76 and 78 of FIGS. 6C and 6D respectively provide dielectric layers 84 with patterned thickness variation. Exemplary arrangement 80 of FIG. 6E provides dielectric layers 84 with matched variable thickness. These exemplary embodiments and others provide improved capacitor performance over a generally wider frequency range.

As mentioned previously, it is an advantage of the present subject matter to provide cascade capacitor embodiments that have a capacitance ranging from about 0.5 µF to over 1 F. FIG. 7 illustrates how such a broad range of capacitance values may be available for selected cascade capacitor embodiments. Preferred embodiments of the subject cascade capacitor comprise at least some aspects of a thin film BGA component 10 and an IDC component 12. Capacitance values for BGA capacitors 10 typically range from about 10 pF to about 500 nF and interdigitated capacitor values may range from about 100 nF to about 10 µF or more with the provision of additional dielectric and electrode layers. Thus, a cascade capacitor that incorporates aspects of a thin film BGA capacitor 10 and an IDC 12 is characterized by generally high capacitance from the IDC 12 and generally low inductance from the BGA capacitor 10. A single layer capacitor 66 offers higher frequency range of operation while maintaining a capacitance range of about 0.1 pF to about 1 nF. Tantalum capacitors offer additional advantages for potential cascade capacitor embodiments while providing a general capacitance range of about 1 µF to about 1 mF. Cascade capacitors that include aspects of a double-layer electrochemical capacitor 68 are characterized by generally high capacitance, as such a double-layer capacitor 68 generally has a capacitance from about 1 mF to about 1 F. Select combinations of certain capacitor aspects can thus combine to form a cascade capacitor embodiment with a variety of potential capacitance values. Multilayer surface mount capacitors can also be used and they cover the ranges of 10, 12 and 64.

FIGS. 8A and 8B display exemplary impedance curves corresponding to selected embodiments of the present subject matter. FIGS. 8A and 8B display how combinations of varied capacitor aspects can combine to form an exemplary cascade capacitor with desirable performance over a wide range of frequencies. FIG. 8A displays impedance values versus frequency of operation for individual capacitor components. Such components include multilayer capacitor components such as an interdigitated device and bulk capacitors such as electrochemical capacitors, tantalum capacitors, or others. A voltage regulator module may often be incorporated into a passive device or other circuit component, and also offers an impedance value to the overall structure. If a cascade capacitor incorporates aspects of all of the above components having impedance curves displayed in FIG. 8A, then the overall impedance curve of the device would be similar to the "Net Z" curve of FIG. 8B. By combining selected features, a device can thus be formed that exhibits generally low impedance over a frequency range from about a KHz to about a GHz. For this exemplary data, a target impedance of around 5-10 mΩ is generally achieved.

While the present subject matter has been described in detail with respect to specific embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed:

1. A method for adjusting the equivalent series resistance (ESR) of a multi-layer component, said method comprising the steps of:
    producing a multilayer component including at least first and second electrically conductive layers separated by an insulating layer;
    providing a resistive layer layered with and substantially covering the insulating layer whereby the first and second electrically conductive layers are separated by individual resistive and insulating layers; and
    adjusting the ESR of the component by varying the effective resistance of the resistive layer.

2. A method as in claim 1, wherein said providing step comprises:
    providing the resistive layer between the insulating layer and one of the first or second electrically conductive layers.

3. A method as in claim 2, wherein said adjusting step comprises:
    perforating one of the first or second electrically conductive layers with a plurality of through-holes; and
    varying the effective resistance of the resistive layer by adjusting the diameter of selected of the plurality of through-holes whereby the extent of coverage of the perforated electrode varies the effective resistance of the resistive layer.

4. A method as in claim 2, wherein said adjusting step comprises:
    varying the effective resistance of the resistive layer by adjusting the thickness of the resistive layer.

5. A method as in claim 2, wherein said adjusting step comprises:
    varying the effective resistance of the resistive layer by adjusting the composition of the resistive layer.

6. A method as in claim 1, wherein said adjusting step comprises:
    varying the effective resistance of the resistive layer by adjusting the thickness of the resistive layer.

7. A method as in claim 1, wherein said adjusting step comprises:
    varying the effective resistance of the resistive layer by adjusting the thickness of the resistive layer.

8. A method of adjusting the resonance characteristics of a multi-layer component, said method comprising the steps of:
    producing a multilayer component having a plurality of successively stacked electrode layers;
    providing a resistive layer layered with and substantially covering an insulating layer whereby the first and second electrically conductive layers are separated by individual resistive and insulating layers;
    providing separate insulating layers sandwiched between each of the electrode layers; and
    varying the thickness of selected of the separate insulating layers such that the separate insulating layers are characterized by at least two different thicknesses, whereby the resonance characteristics of the multi-layer component are adjusted.

* * * * *

UNITED STATES PATENT AND TRADEMARK OFFICE
CERTIFICATE OF CORRECTION

| | | |
|---|---|---|
| PATENT NO. | : 7,263,764 B2 | Page 1 of 1 |
| APPLICATION NO. | : 10/647939 | |
| DATED | : September 4, 2007 | |
| INVENTOR(S) | : Robert Heistand, II et al. | |

It is certified that error appears in the above-identified patent and that said Letters Patent is hereby corrected as shown below:

In Column 16, line 16, please replace "adjusting the thickness" with --adjusting the composition--.

Signed and Sealed this

Eleventh Day of December, 2007

JON W. DUDAS
*Director of the United States Patent and Trademark Office*